(12) United States Patent
Ning et al.

(10) Patent No.: US 12,431,198 B2
(45) Date of Patent: Sep. 30, 2025

(54) CHARGE LOSS ACCELERATION DURING PROGRAMMING OF MEMORY CELLS IN A MEMORY SUB-SYSTEM

(71) Applicant: Micron Technology, Inc., Boise, ID (US)

(72) Inventors: Sheyang Ning, San Jose, CA (US); Lawrence Celso Miranda, San Jose, CA (US); Zhengyi Zhang, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 273 days.

(21) Appl. No.: 18/077,681

(22) Filed: Dec. 8, 2022

(65) Prior Publication Data

US 2023/0207018 A1    Jun. 29, 2023

Related U.S. Application Data

(60) Provisional application No. 63/293,390, filed on Dec. 23, 2021.

(51) Int. Cl.
    *G11C 16/10*    (2006.01)
    *G11C 16/04*    (2006.01)
    *G11C 16/16*    (2006.01)
    *G11C 16/34*    (2006.01)

(52) U.S. Cl.
    CPC ........ *G11C 16/102* (2013.01); *G11C 16/0433* (2013.01); *G11C 16/16* (2013.01); *G11C 16/3459* (2013.01)

(58) Field of Classification Search
    CPC ............................ G11C 16/102; G11C 16/10
    USPC ..................................................... 365/189.11
    See application file for complete search history.

(56) References Cited

U.S. PATENT DOCUMENTS

| | | | |
|---|---|---|---|
| 8,488,384 B2* | 7/2013 | Kim | G11C 11/5628 |
| | | | 365/189.11 |
| 2009/0257280 A1* | 10/2009 | Oh | G11C 16/10 |
| | | | 365/185.18 |
| 2017/0140829 A1* | 5/2017 | Park | G11C 16/20 |
| 2020/0243144 A1* | 7/2020 | Shim | G11C 11/5671 |
| 2021/0201982 A1* | 7/2021 | Choi | G11C 16/26 |
| 2022/0310166 A1* | 9/2022 | Ning | G11C 16/10 |

* cited by examiner

*Primary Examiner* — Muna A Techane
(74) *Attorney, Agent, or Firm* — Lowenstein Sandler LLP

(57) ABSTRACT

Control logic in a memory device causes a programming pulse of a set of programming pulses associated with a programming algorithm to be applied to a selected wordline associated with a set of memory cells to be programmed to a target voltage level representing a programming level. Voltage levels of the selected wordline and one or more unselected wordlines of the memory array are discharged to approximately a ground voltage level and a bitline voltage level is applied to a bitline corresponding to the programming level. The selected wordline and a set of unselected wordlines are charged to approximately a pass voltage level followed by the discharge of the selected wordline to a reverse bias level to establish an erase voltage level on the set of memory cells. The control logic further performs a program verify operation corresponding to the programming level associated with the set of memory cells.

20 Claims, 12 Drawing Sheets

| 350₀ | 350₁ | 350₂ | 350₃ |
|---|---|---|---|
| Block₀ 250₀ | Block₀ 250₀ | Block₀ 250₀ | Block₀ 250₀ |
| Block₁ 250₁ | Block₁ 250₁ | Block₁ 250₁ | Block₁ 250₁ |
| Block₂ 250₂ | Block₂ 250₂ | Block₂ 250₂ | Block₂ 250₂ |
| Block₃ 250₃ | Block₃ 250₃ | Block₃ 250₃ | Block₃ 250₃ |
| Block₄ 250₄ | Block₄ 250₄ | Block₄ 250₄ | Block₄ 250₄ |
| ⋮ | ⋮ | ⋮ | ⋮ |
| Block_{L-4} 250_{L-4} | Block_{L-4} 250_{L-4} | Block_{L-4} 250_{L-4} | Block_{L-4} 250_{L-4} |
| Block_{L-3} 250_{L-3} | Block_{L-3} 250_{L-3} | Block_{L-3} 250_{L-3} | Block_{L-3} 250_{L-3} |
| Block_{L-2} 250_{L-2} | Block_{L-2} 250_{L-2} | Block_{L-2} 250_{L-2} | Block_{L-2} 250_{L-2} |
| Block_{L-1} 250_{L-1} | Block_{L-1} 250_{L-1} | Block_{L-1} 250_{L-1} | Block_{L-1} 250_{L-1} |
| Block_L 250_L | Block_L 250_L | Block_L 250_L | Block_L 250_L |
| 240₀ | 240₁ | 240₂ | 240₃ |

|  | WLn-1 and below | WLn | WLn+1 and above |
|---|---|---|---|
| Step 1 | After a programming pulse, all wordlines are discharged to ~0V | | |
| Step 2 | For one or more pillars corresponding to programming levels being programmed), $V_{BL}$=VCC to float the pillar(s); For one or more pillars corresponding to levels that passed programming, $V_{BL}$= ~0V so the pillars conduct | | |
| Step 3 | Charge to Vpass (~8V or higher) on WL group or maintain at ~0V | | Charge to Vpass (~8V or higher) |
| Step 4 | Maintain voltage level | Discharge to (or maintain) at ~0V or below 0V (e.g., ~ -2.5V) | Maintain voltage level |

CHARGE LOSS ACCELERATION DURING PROGRAMMING OF MEMORY CELLS IN A MEMORY SUB-SYSTEM

CROSS-REFERENCE TO RELATED APPLICATION

This application claims the benefit of U.S. Provisional Application No. 63/293,390, titled "Charge Loss Acceleration During Programming of Memory Cells in a Memory Sub-System," filed Dec. 23, 2021, the entire disclosure of which is incorporated herein by reference.

TECHNICAL FIELD

Embodiments of the disclosure relate generally to memory sub-systems, and more specifically, relate to charge loss acceleration during programming of memory cells in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 3 is a block schematic of a portion of an array of memory cells as could be used in a memory of the type described with reference to FIG. 1B according to an embodiment.

FIG. 5 illustrates steps of an erase sub-operation of a programming operation to manage charge loss acceleration during programming of target memory cells of a target wordline according to one or more embodiments of the present disclosure.

DETAILED DESCRIPTION

Figure 1A:
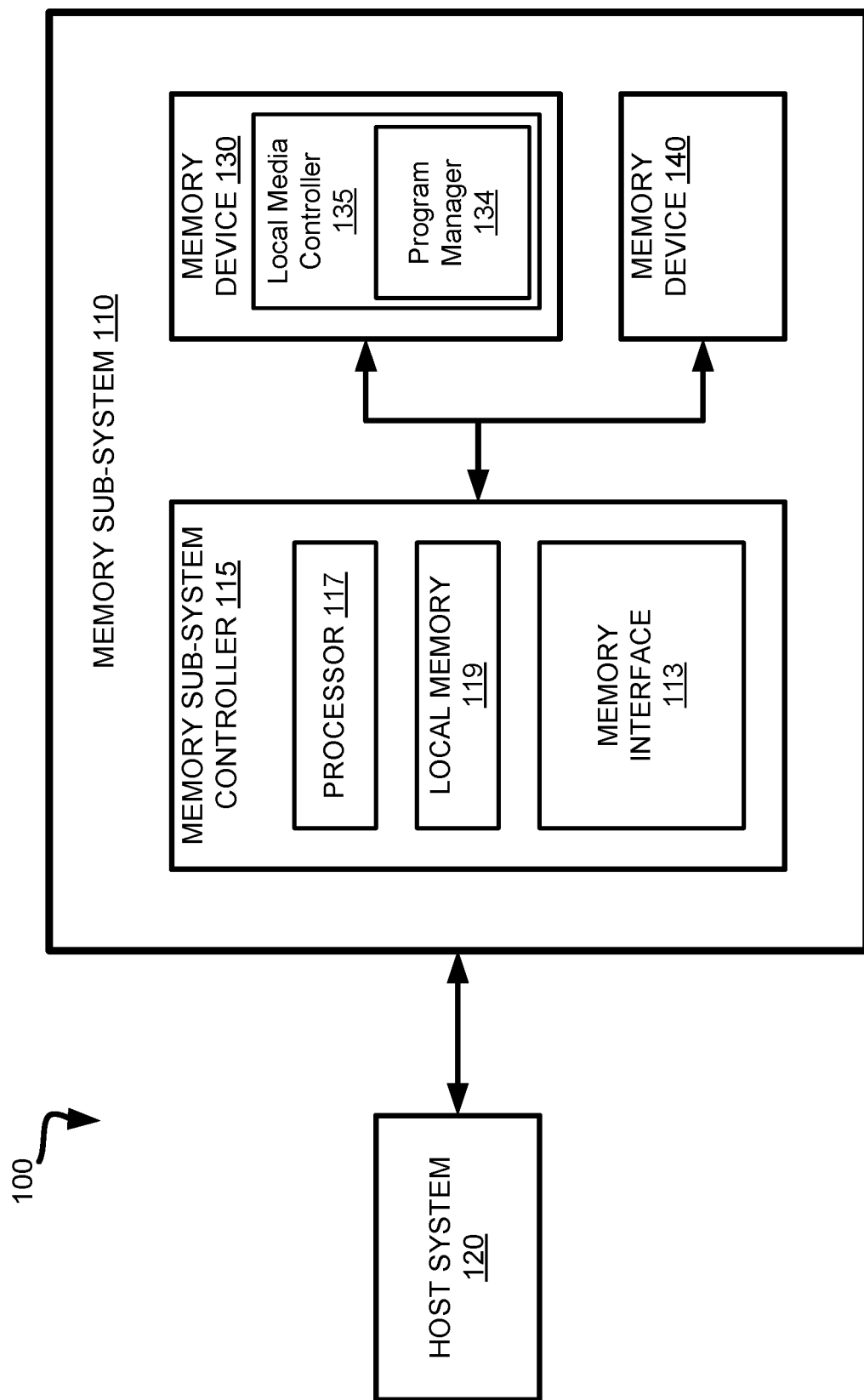
FIG. 1A illustrates an example computing system that includes a memory sub-system in accordance with some embodiments.

Aspects of the present disclosure are directed to programming of a memory device in a memory sub-system using a push-pull or soft erase operation. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a not-and (NAND) memory device. Other examples of non-volatile memory devices are described below in conjunction with FIG. 1A. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

Memory cells are formed on a silicon wafer in an array of columns (also hereinafter referred to as "bitlines") and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell.

A block hereinafter refers to a unit of the memory device used to store data and can include a group of memory cells, a wordline group, a wordline, or individual memory cells. Each block can include a number of sub-blocks, where each sub-block is defined by an associated pillar (e.g., a vertical conductive trace) extending from a shared bitline. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of poly-silicon channel material (i.e., a channel region). The memory cells can be coupled to access lines (i.e., wordlines) often fabricated in common with the memory cells, so as to form an array of strings in a block of memory (e.g., a memory array). The compact nature of certain non-volatile memory devices, such as 3D flash NAND memory, means wordlines are common to many memory cells within a block of memory. Some memory devices use certain types of memory cells, such as triple-level cell (TLC) memory cells, which store three bits of data in each memory cell, which make it affordable to move more applications from legacy hard disk drives to newer memory sub-systems, such as NAND solid-state drives (SSDs).

Memory access operations (e.g., a program operation, an erase operation, etc.) can be executed with respect to the memory cells by applying a wordline bias voltage to wordlines to which memory cells of a selected page are connected. For example, during a programming operation, one or more selected memory cells can be programmed with the application of a programming voltage to a selected wordline. In one approach, an Incremental Step Pulse Programming (ISPP) process or scheme can be employed to maintain a tight cell threshold voltage distribution for higher data reliability. In ISPP, a series of high-amplitude pulses of voltage levels having an increasing magnitude (e.g., where the magnitude of subsequent pulses are increased by a predefined pulse step height) are applied to wordlines to which one or more memory cells are connected to gradually raise the voltage level of the memory cells to above a wordline voltage level corresponding to the memory access operation (e.g., a target program level). The application of the uniformly increasing pulses by a wordline driver of the memory device enables the selected wordline to be ramped or increased to a wordline voltage level ($V_{wl}$) corresponding to a memory access operation. Similarly, a series of voltage pulses having a uniformly increasing voltage level can be applied to the wordline to ramp the wordline to the corresponding wordline voltage level during the execution of an erase operation.

The series of incrementing voltage programming pulses are applied to the selected wordline to increase a charge level, and thereby a threshold voltage (Vt), of each memory cell connected to that wordline. After each programming pulse, or after a number of programming pulses, a program verify operation is performed to determine if the threshold voltage of the one or more memory cells has increased to a desired programming level (e.g., a stored target threshold voltage corresponding to a programming level). A program verify operation can include storing a target threshold voltage in a page buffer that is coupled to each data line (e.g., bitline) and applying a ramped voltage to the control gate of the memory cell being verified. When the ramped voltage reaches the threshold voltage to which the memory cell has been programmed, the memory cell turns on and sense circuitry detects a current on a bit line coupled to the memory cell. The detected current activates the sense circuitry to compare if the present threshold voltage is greater than or equal to the stored target threshold voltage. If the present threshold voltage is greater than or equal to the target threshold voltage, further programming is inhibited.

During programming, the sequence of programming pulses can be incrementally increased in value (e.g., by a step voltage value such as 0.33V) to increase a charge stored on a charge storage structure corresponding to each pulse. The memory device can reach a target programming level voltage for a particular programming level by incrementally storing or increasing amounts of charge corresponding to the programming step voltage.

According to this approach, the series of programming pulses and program verify operations are applied to program each programming level (e.g., programming levels L1 to L7 for a TLC memory cell) in sequence. For example, this approach sequentially programs the levels of the memory cell (e.g., L1 to L7) by applying a first set of pulses to program level L1 to a first target voltage level, followed by the application of a second set of pulses to program level L2 to a second target voltage level, and so on until all of the levels are programmed.

Immediately after programming, the floating gate can experience multiple forms of charge loss that occur at the time of ion implantation that can cause defects in the data retention characteristics of the floating gate. These include single bit charge loss, intrinsic charge loss, and quick charge loss. Single bit charge loss is the result of a defective memory cell that exhibits electron leakage. This leakage can be accelerated with voltage or high temperature stress and results in inferior data retention. Intrinsic charge loss is an immediate leakage of electrons from the floating gate, closest to the tunnel oxide, after a programming pulse. The trapped charge initially causes the memory cell Vt to appear higher than the level to which the floating gate is programmed. The leakage of these electrons after programming then causes a one time shift in the threshold voltage. Quick charge loss also causes an immediate Vt shift after a programming pulse. Quick charge loss is the result of electrons trapped in the tunnel oxide layer after the programming pulse moving back into the channel region. When a cell passes the verify operation, the programmed threshold voltage appears to be higher due to the trapped charge in the tunnel oxide. When the memory cell is read after the program operation has been completed, the cell has a Vt that is lower than the Vt obtained during the program verify operation due to the charge in the tunnel oxide leaking out to the channel region. Accordingly, due to charge loss, a memory cell that was initially identified as passing the verify operation can have a reduction of the corresponding Vt such that, subsequently, the memory cell no longer passes the verify operation.

Disadvantageously, shallow trap electrons are lost slowly after program completion. This causes the programming distribution to widen from the target distribution. Since this loss occurs slowly, after program completion, the memory sub-system is unable to control or account for this loss and the wider programming distributions that result.

This results in the expansion of the threshold voltage distributions in order to accommodate all possible threshold voltages for a given state. Furthermore, the charge loss associated with the shallow trap electrons can result in a reduction in the read window budget (RWB) corresponding to the programming distributions associated with the various programming levels. The RWB can refer to the cumulative value (e.g., in voltage) of a number (e.g., seven) of distances (e.g., measured in voltage) between adjacent threshold voltage distributions at a particular BER.

Certain systems attempt to address the negative effects of charge loss by implementing a wordline potential to accelerate charge loss prior to the program verify operation to avoid the above-identified problems. For example, a negative biasing pulse can be applied prior to the program verify ramped pulse to accelerate the charge loss and achieve more accurate program verification. In this approach, the bitline can be set to approximately 0V, the pillar is set to approximately a ground voltage level (e.g., approximately 0V), and the reverse bias voltage (e.g., approximately −2.5V) is applied to the target wordline associated with the memory cells being programmed. Accordingly, the memory cell is subjected to approximately a 2.5V erase voltage (e.g., when the wordline voltage is lower than the bitline voltage, the memory cell is subjected to an erase polarity). However, this approach is limited to a low wordline voltage due to the cost associated with a negative voltage circuit. Furthermore, use of a low negative wordline voltage (e.g., approximately −2.5V) results in very limited RWB gain.

According to aspects of the present disclosure, a programming operation (also referred to as a "push-pull programming operation") is executed to program target memory cells of a memory device. The programming operation includes an erase sub-operation or "soft erase sub-operation" that is performed between a programming pulse and program verify operation to manage charge loss acceleration associated with the target memory cells being programmed. In an embodiment, the erase sub-operation involves the use of a "softer" or lower erase voltage (e.g., Vera of approximately 10V) that is applied to the target memory cells, as compared to a "hard" or typical erase voltage (e.g., approximately 20V). In an embodiment, execution of the erase sub-operation (also referred to as the "soft erase sub-operation") following a programming pulse accelerates the charge loss to enable the charge loss to be identified and addressed during the subsequent program verify operations of the programming operation cycle.

The "push-pull" terminology refers to the multi-phase programming operation described herein where, during the programming pulse, electrons are pushed from the channel to the memory cell. In order to accelerate the charge loss of the shallow trap electrons of the memory cell, the programming pulse is followed by the soft erase sub-operation during which those shallow trap electrons are pulled out from the memory cell back into the channel. The pulling of the shallow trap electrons back into the channel accelerates the charge loss prior to the execution of the program verify phase, thereby enabling the effects of the charge loss to be discovered and addressed during the programming cycle. Advantageously, the push-pull programming operation including applying a soft erase sub-operation between a programming pulse sub-operation and the program verify sub-operation results in the acceleration of the charge loss and improvement in RWB gain on both lower programming levels and higher programming levels. This results in improved performance in the memory device as the RWB is improved while the programming time is decreased compared to using other techniques, such as program voltage step modulation.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. In one embodiment, the term "MLC memory" can be used to represent any type of memory cell that stores more than one bit per cell (e.g., 2 bits, 3 bits, 4 bits, or 5 bits per cell).

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, memory device 130 includes a program manager 134 configured to carry out corresponding memory access operations, in response to receiving the memory access commands from memory interface 113. In some embodiments, local media controller 135 includes at least a portion of program manager 134 and is configured to perform the functionality described herein. In some embodiments, program manager 134 is implemented on memory device 130 using firmware, hardware components, or a combination of the above. In one embodiment, program manager 134 receives, from a requestor, such as memory interface 113, a request to program data to a memory array of memory device 130. The memory array can include an array of memory cells formed at the intersections of wordlines and bitlines. In one embodiment, the memory cells are grouped into blocks, which can be further divided into sub-blocks, where a given wordline is shared across a number of sub-blocks, for example. In one embodiment, each sub-block corresponds to a separate plane in the memory array. The group of memory cells associated with a wordline within a sub-block is referred to as a physical page. In one embodiment, there can be multiple portions of the memory array, such as a first portion where the sub-blocks are configured as SLC memory and a second portion where the sub-blocks are configured as multi-level cell (MLC) memory (i.e., including memory cells that can store two or more bits of information per cell). For example, the second portion of the memory array can be configured as TLC memory. The voltage levels of the memory cells in TLC memory form a set of 8 programming distributions representing the 8 different combinations of the three bits stored in each memory cell. Depending on how the memory cells are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

In one embodiment, program manager 134 can receive data to be programmed to the memory device 130 (e.g., a TLC memory device). Accordingly, program manager 134 can execute a programming algorithm including a sequence of programming pulses applied to respective wordlines of memory cells to be programmed to target programming levels. In an embodiment, the programming algorithm can include a push-pull programming algorithm where each programming pulse of the series of incrementally-increasing programming pulses is followed by an erase sub-operation to manage charge loss acceleration prior to the execution of a program verify phase.

In one embodiment, program manager 134 executes a series of steps of the erase sub-operation (or soft erase sub-operation) following the application of a programming pulse to a target wordline associated with the one or more memory cells to be programmed. In an embodiment, the soft erase sub-operation includes discharging of all wordlines (e.g., a selected or target wordline (WLn) and one or more unselected wordlines (e.g., WLn−1 and below and WLn+1 and above). In an embodiment, the soft erase sub-operation includes applying a bitline voltage (Vbl_high) to one or more bitlines to float the one or more pillars corresponding to the one or more levels in program.

In an embodiment, one or more of the unselected wordlines (i.e., WLn−1 and below and WLn+1 and above) are charged to a pass voltage level (Vpass) of approximately 8V to boost the pillars in program to the Vpass level (e.g., approximately 8V). With the pillar voltage boosted, a reverse bias or negative voltage (e.g., approximately −2.5V) is applied is applied to the selected or target wordline (WLn) to enable an erase bias of approximately 10V to be applied to the one or more target memory cells associated with the selected wordline. The erase voltage of approximately 10V experienced by the target memory cells is a "softer" or lower erase voltage as compared to a typical "hard" erase operation which involves the use of an erase voltage of approximately 20V. The execution of the soft erase sub-operation by program manager 134 accelerates the charge loss prior to performance of a program verify operation to produce more accurate verification results. This advantageously enables memory cells that have not reached the programming voltage due to charge loss to have the impact of the charge loss accelerated so that it can be identified during the program verify stage and remedied by applying one or more further programming pulses to the target memory cells.

In an embodiment, following completion of the soft erase sub-operation and the associated acceleration of the charge loss, program manager 134 executes a program verify phase to verify the programming of the memory cells and identify the memory cells that, due to the accelerated charge loss, have not yet reached the desired programming voltage and are to be subjected to additional programming pulses.

Figure 1B:
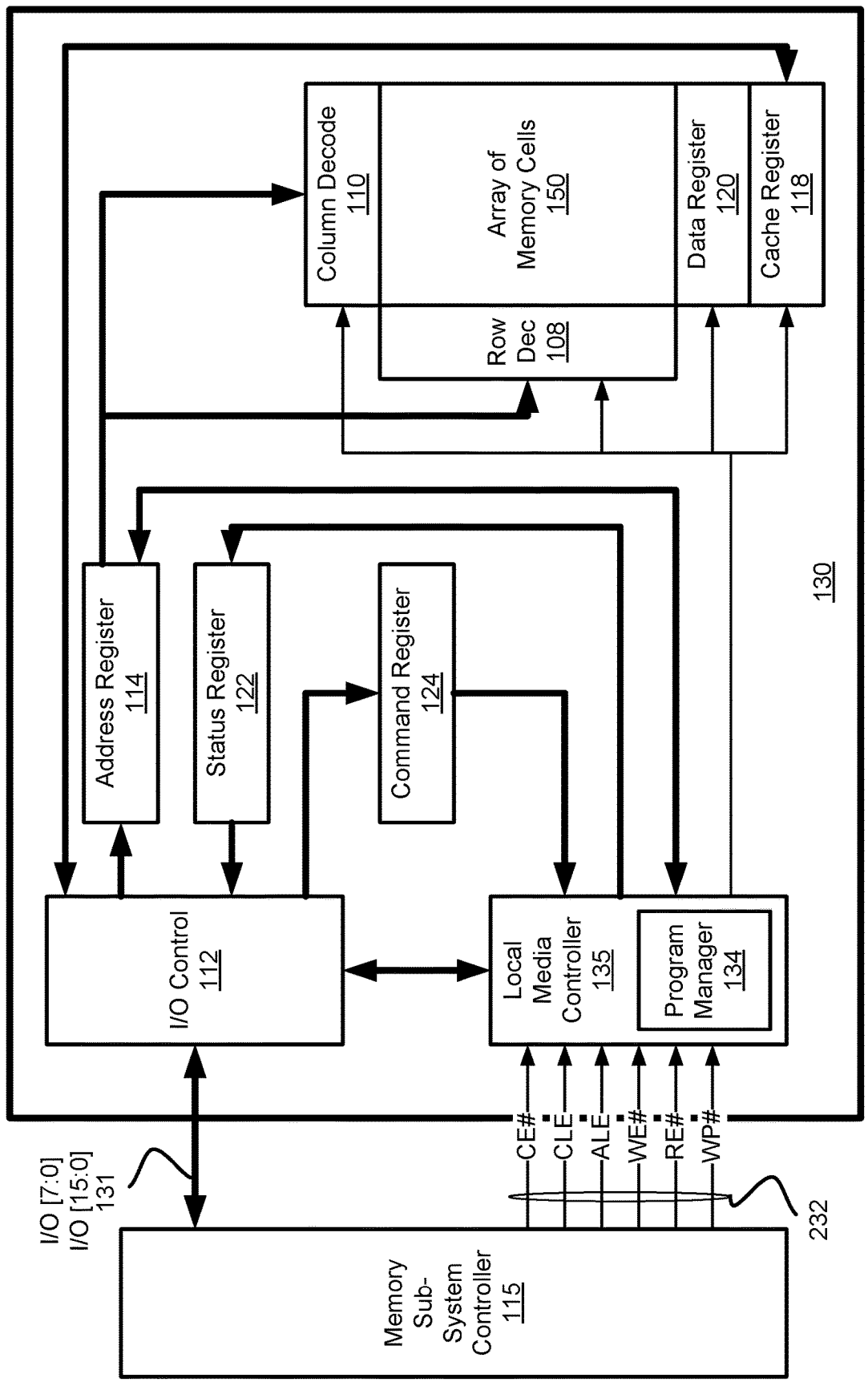
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 150 logically arranged in rows and columns. Memory cells of a logical row are typically connected to the same access line (e.g., a wordline) while memory cells of a logical column are typically selectively connected to the same data line (e.g., a bitline). A single access line may be associated with more than one logical row of memory cells and a single data line may be associated with more than one logical column. Memory cells (not shown in FIG. 1B) of at least a portion of array of memory cells 250 are capable of being programmed to one of at least two target data states.

Row decode circuitry 108 and column decode circuitry 110 are provided to decode address signals. Address signals are received and decoded to access the array of memory cells 150. Memory device 130 also includes input/output (I/O) control circuitry 112 to manage input of commands, addresses and data to the memory device 130 as well as output of data and status information from the memory device 130. An address register 114 is in communication with I/O control circuitry 212 and row decode circuitry 108 and column decode circuitry 110 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 150 in response to the commands and generates status information for the external memory sub-system controller 115, i.e., the local media controller 135 is configured to perform access operations (e.g., read operations, programming operations and/or erase operations) on the array of memory cells 150. The local media controller 135 is in communication with row decode circuitry 108 and column decode circuitry 110 to control the row decode circuitry 108 and column decode circuitry 110 in response to the addresses. In one embodiment, local media controller 135 includes program manager 134, which can implement the push-pull programming operation including the soft erase sub-operation to manage charge loss during programming of memory device 130, as described herein.

The local media controller 135 is also in communication with a cache register 118. Cache register 118 latches data, either incoming or outgoing, as directed by the local media controller 135 to temporarily store data while the array of memory cells 150 is busy writing or reading, respectively, other data. During a program operation (e.g., write operation), data may be passed from the cache register 118 to the data register 120 for transfer to the array of memory cells 150; then new data may be latched in the cache register 118 from the I/O control circuitry 212. During a read operation, data may be passed from the cache register 118 to the I/O control circuitry 112 for output to the memory sub-system controller 115; then new data may be passed from the data register 120 to the cache register 118. The cache register 118 and/or the data register 120 may form (e.g., may form a portion of) a page buffer of the memory device 130. A page buffer may further include sensing devices (not shown in FIG. 1B) to sense a data state of a memory cell of the array of memory cells 150, e.g., by sensing a state of a data line connected to that memory cell. A status register 122 may be in communication with I/O control circuitry 112 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE#, a command latch enable signal CLE, an address latch enable signal ALE, a write enable signal WE#, a read enable signal RE#, and a write protect signal WP#. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 131 and outputs data to the memory sub-system controller 115 over I/O bus 131.

For example, the commands may be received over input/output (I/O) pins [7:0] of I/O bus 131 at I/O control circuitry 112 and may then be written into command register 124. The addresses may be received over input/output (I/O) pins [7:0] of I/O bus 234 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 150.

In an embodiment, cache register 118 may be omitted, and the data may be written directly into data register 120. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2A:
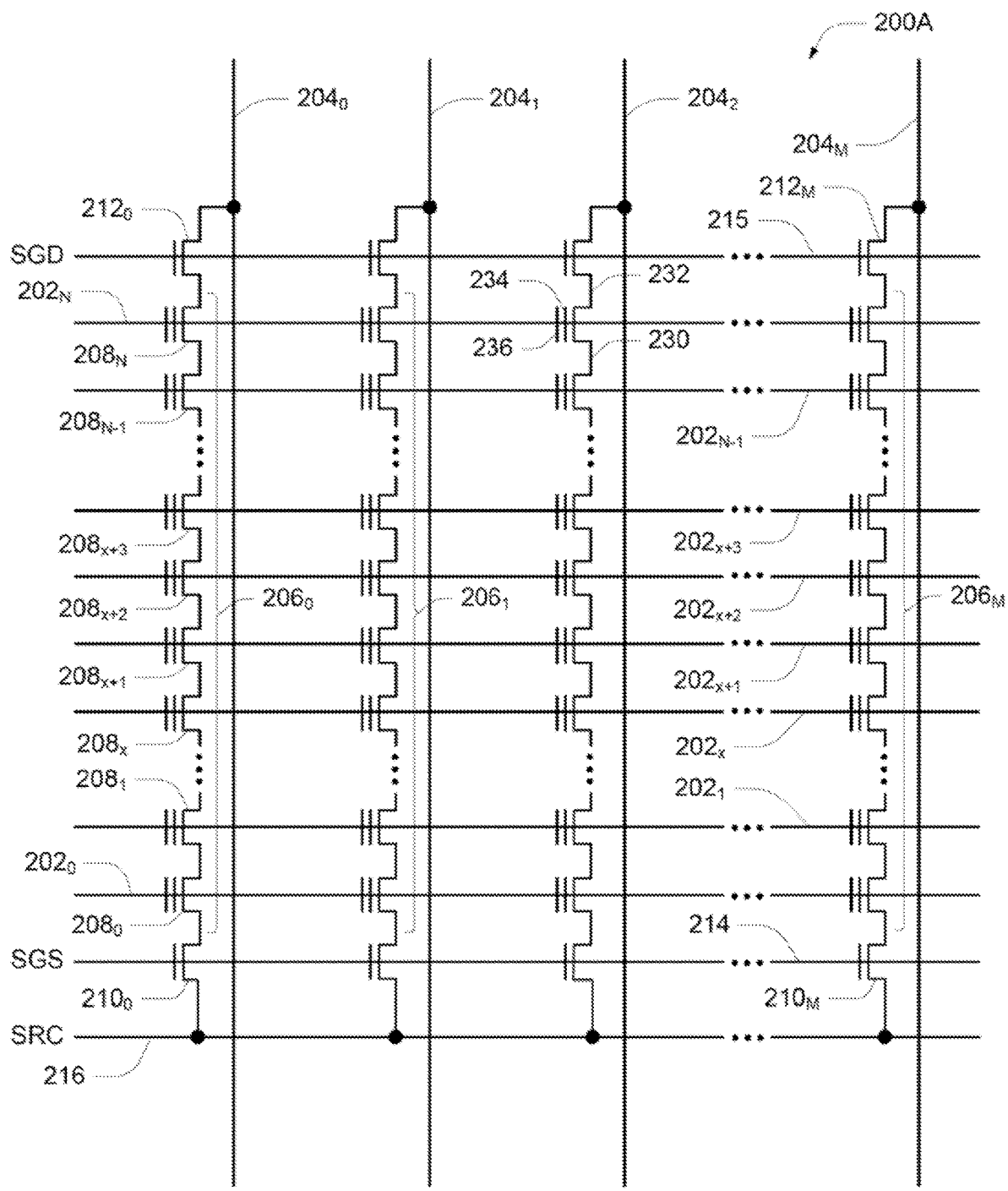
FIGS. 2A-2C are schematics of portions of an array of memory cells as could be used in a memory of the type described with reference to FIG. 1B according to an embodiment.
Figure 2B:
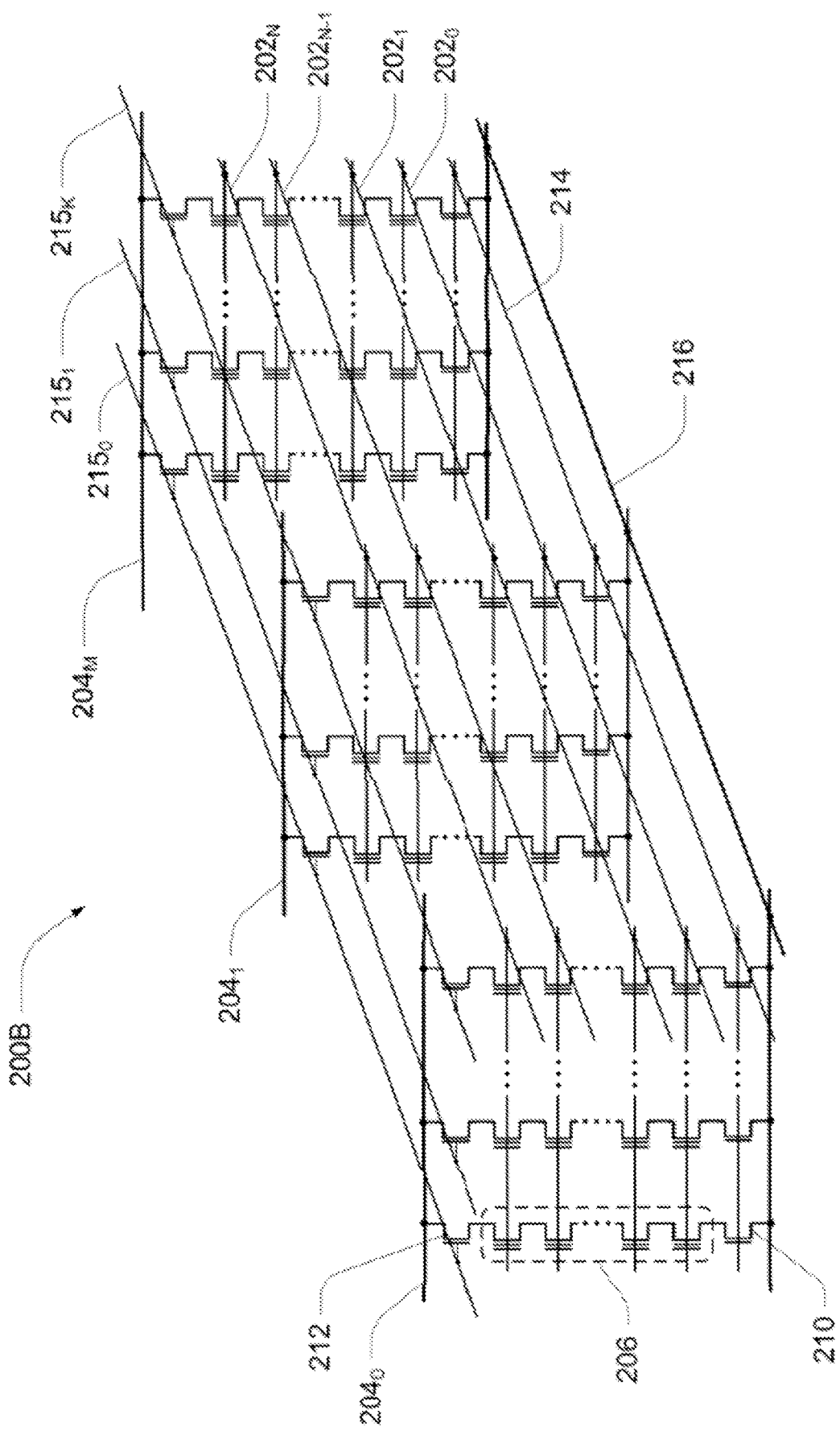
Figure 2C:
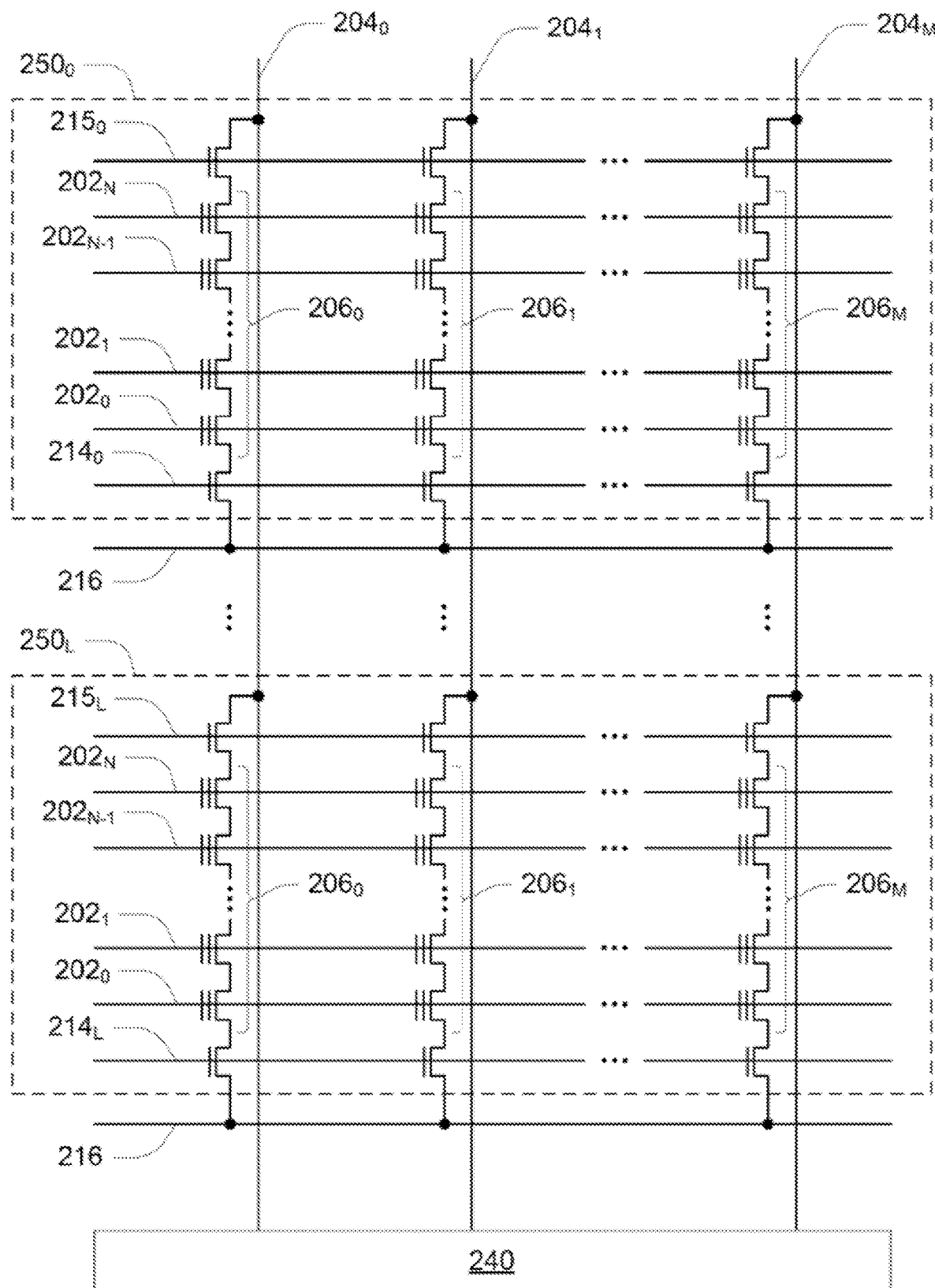

FIG. 2A-2C are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as wordlines $202_0$ to $202_N$, and data lines, such as bitlines $204_0$ to $204_M$. The wordlines 202 can be connected to global access lines (e.g., global wordlines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a wordline 202) and columns (each corresponding to a bitline 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bitline 204 for the corresponding NAND string 206. For example, the drain of select gate $212_0$ can be connected to the bitline $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bitline 204. A control gate of each select gate 212 can be connected to select line 215.

The memory array 200A in FIG. 2A can be a quasi-two-dimensional memory array and can have a generally planar structure, e.g., where the common source 216, NAND strings 206 and bitlines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bitline 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bitlines 204 (e.g., bitlines $204_0$, $204_2$, $204_4$, etc.) can be one physical page of the memory cells 208 (e.g., even memory cells) while memory cells 208 commonly connected to wordline $202_N$ and selectively connected to odd bitlines 204 (e.g., bitlines $204_1$, $204_3$, $204_5$, etc.) can be another physical page of the memory cells 208 (e.g., odd memory cells).

Although bitlines $204_3$-$204_5$ are not explicitly depicted in FIG. 2A, it is apparent from the figure that the bitlines 204 of the array of memory cells 200A can be numbered consecutively from bitline $204_0$ to bitline $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bitline $204_0$-$204_m$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bitline 204. Subsets of NAND strings 206 can be connected to their respective bitlines 204 by biasing the select lines $215_0$-$215_K$ to selectively activate particular select transistors 212 each between a NAND string 206 and a bitline 204. The select transistors 210 can be activated by biasing the select line 214. Each wordline 202 can be connected to multiple rows of memory cells of the memory array 200B. Rows of memory cells that are commonly connected to each other by a particular wordline 202 can collectively be referred to as tiers.

FIG. 2C is a further schematic of a portion of an array of memory cells 200C as could be used in a memory of the type described with reference to FIG. 1B, e.g., as a portion of the array of memory cells 104. Like numbered elements in FIG. 2C correspond to the description as provided with respect to FIG. 2A. The array of memory cells 200C can include strings of series-connected memory cells (e.g., NAND strings) 206, access (e.g., word) lines 202, data (e.g., bit) lines 204, select lines 214 (e.g., source select lines), select lines 215 (e.g., drain select lines) and a source 216 as depicted in FIG. 2A. A portion of the array of memory cells 200A can be a portion of the array of memory cells 200C, for example.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bitlines $204_0$-$204_m$ can be connected (e.g., selectively connected) to a buffer portion 240, which can be a portion of the page buffer 152 of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bitlines 204.

FIG. 3 is a block schematic of a portion of an array of memory cells 300 as could be used in a memory of the type described with reference to FIG. 1B. The array of memory cells 300 is depicted as having four memory planes 350 (e.g., memory planes $350_0$-$350_3$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $250_0$-$250_L$).

Figure 4:
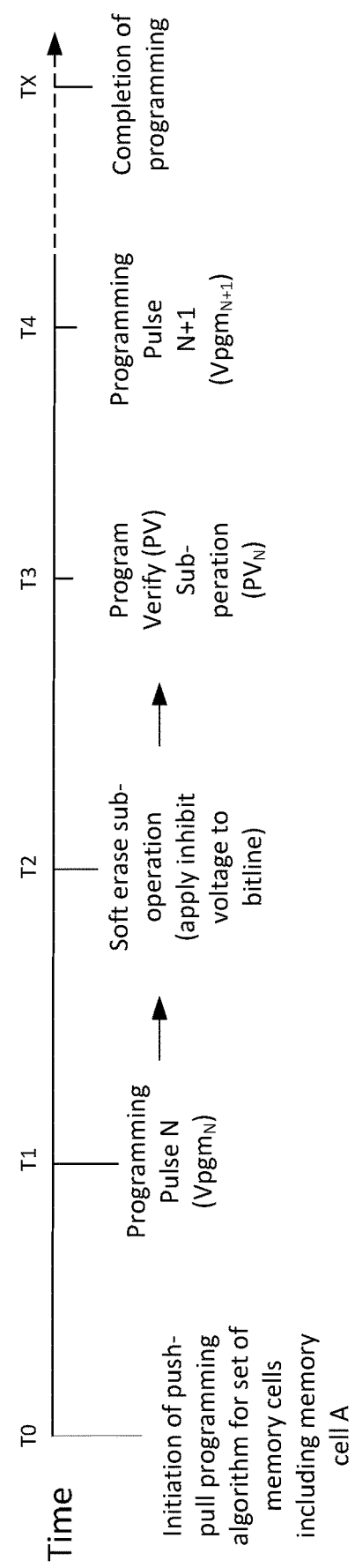
FIG. 4 is an example timeline corresponding to execution of a push-pull operation including am erase sub-operation to manage charge loss acceleration during programming of memory cells of a memory device in accordance with one or more embodiments of the present disclosure.

FIG. 4 is an example timeline corresponding to execution of a push-pull operation including an erase sub-operation to manage charge loss acceleration during programming of memory cells of a memory device in accordance with one or more embodiments of the present disclosure. As shown in FIG. 4, a push-pull program operation or algorithm can be initiated at a first time (T0) to program a set of target memory cells of a memory device. At a subsequent time (T1), a first programming pulse (programming pulse N) of a series of programming pulses is applied to a target wordline (WLn) associated with the target memory cells. In an embodiment, programming pulse N is applied at programming voltage VpgmN, programming pulse N+1 is applied at programming voltage VpgmN+1 (where VpgmN+1=VpgmN+a step voltage level (Vstep)), programming pulse N+2 is applied at programming voltage VpgmN+2 ((where VpgmN+2=VpgmN+1+Vstep), and so on until completion of the programming cycle (e.g., at time TX).

In an embodiment, at a subsequent time (T2) following the programming pulse (programming pulse N), an erase sub-operation is executed. In an embodiment, the erase sub-operation or soft erase sub-operation includes multiple steps performed to manage charge loss acceleration relating to the target memory cells to enable discovery of the effects of the charge loss during a subsequent program verify sub-operation.

In an embodiment, at a subsequent time (T3), following completion of the soft erase sub-operation and resulting acceleration of the charge loss, a program verify sub-operation is performed (e.g., $PV_N$). In an embodiment, the program verify sub-operation executed at T3 can identify whether a target memory cell has reached a corresponding target programming level in view of the associated charge loss which is accelerated and accounted for in view of the previous soft erase sub-operation. As shown in FIG. 4, at time T4, a next programming pulse (programming pulse N+1) of the series of programming pulses of the programming algorithm is applied. In an embodiment, the cycle of programming pulse, followed by a soft erase sub-operation, followed by a program verify sub-operation is repeated until the one or more target cells have been programmed to the desired programming level (e.g., at time TX).

FIG. 5 illustrates steps of an erase sub-operation of a programming operation to manage charge loss acceleration during programming of target memory cells of a target wordline according to one or more embodiments of the present disclosure. As shown in FIG. 5, the steps of the soft erase sub-operation are described with respect to a target wordline (WLn) associated with the one or more target memory cells, a first set of unselected wordlines (e.g., a set of wordlines that have already been programmed, such as, for example, WLn−1 and below), and a second set of unselected wordlines (e.g., a set of wordlines that have not been programmed, such as, for example, WLn+1 and above). As described above, the steps of the soft erase sub-operation are executed following programming pulse of a programming algorithm (e.g., the push-pull programming algorithm) and before a program verify sub-operation to manage the acceleration of the charge loss associated with the one or more target memory cells. In an embodiment, the steps of the soft erase sub-operation shown in FIG. 5 can be iteratively repeated following each programming pulse of a series of programming pulses of the programming algorithm until the target memory cells are programmed and the programming algorithm cycle is completed.

Figure 6:
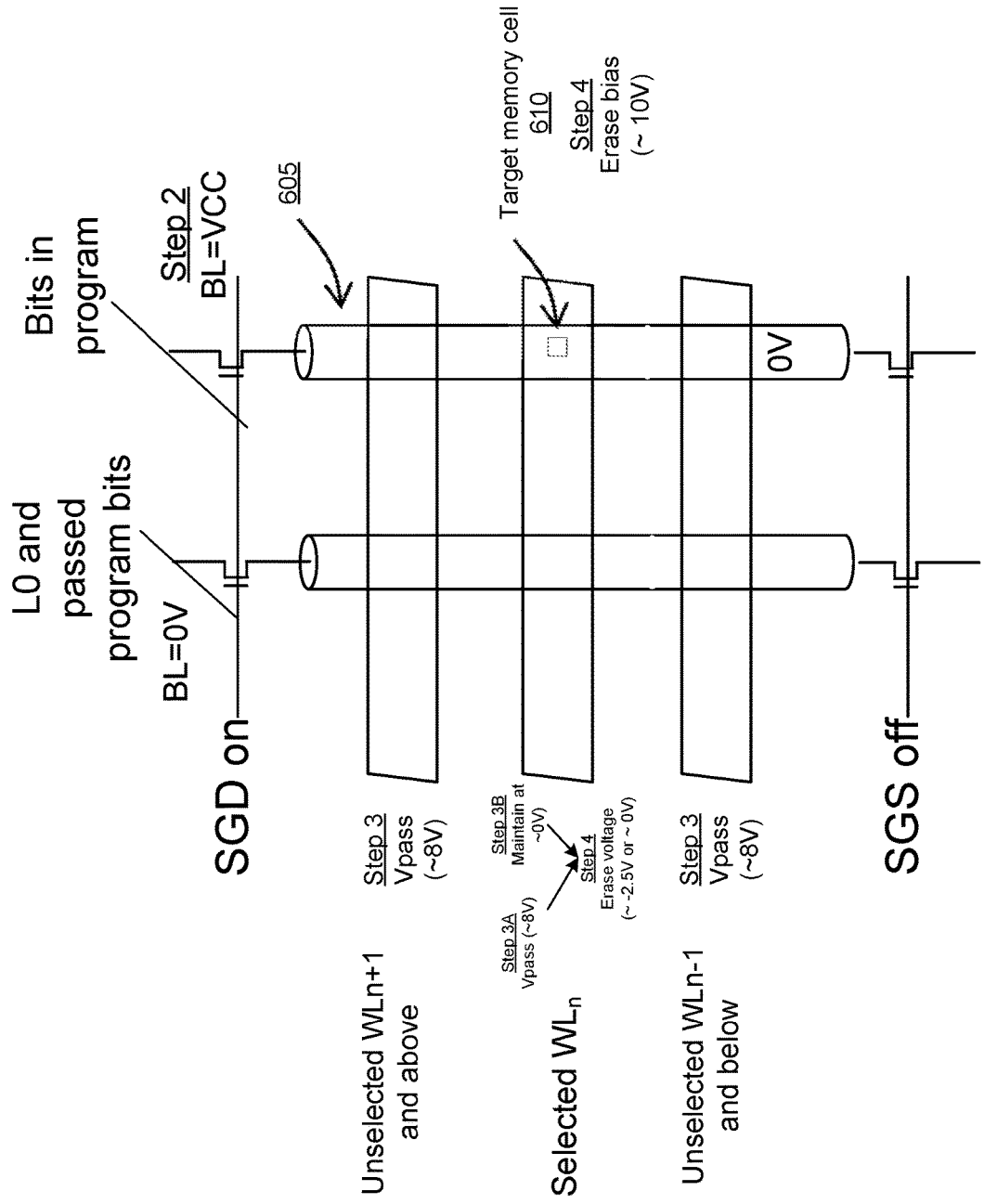
FIG. 6 illustrates an example memory array including wordlines and bitlines corresponding to memory cells to be programmed according to a programming operation including an erase sub-operation to manage charge loss acceleration in accordance with one or more embodiments of the present disclosure.

FIG. 6 illustrates an example set of pillars in an example memory array including a target or selected wordline (WLn) associated with an example target memory cell 610 during the steps of the soft erase sub-operation illustrated and described with reference to FIG. 5, according to embodiments of the present disclosure. As shown in FIG. 6, the example memory array includes a set of pillars corresponding to substantially vertical strings of series coupled memory cells of the memory array. In an embodiment, the pillars refer to the channel regions (e.g., composed of polysilicon) of the access transistors of a vertical string of memory cells. According to embodiments, each of the pillars are floated and a corresponding voltage is boosted at different voltage levels (Vpillar). In an embodiment, the drain-side select transistor (SGD) gates for different memory cells in a memory page are grouped or ganged and may remain at a high voltage level to turn "on" the SGD on an erase level (L0) and the program passed cells for conducting the pillar. In an embodiment, the SGD is cutoff for programming cells. In an embodiment, setting the corresponding bitline to VCC can cutoff the SGD, even if the SGD gate voltage is "on". Accordingly, SGD can be cutoff for programming cells even when the SGD gate voltage is "on", as shown in FIG. 6.

For the programming cell's, its pillar is floated (the SGD is off at this pillar) by raising VBL=VCC. So, even SGD gate voltage is "on", the SGD cell is still off.

at different times by turning the source-side select transistor (SGS) and the drain-side select transistor (SGD) off. In an embodiment, the channel region is first discharged to ground before being floated and boosted to a particular voltage. In an embodiment, once a respective pillar is floated, a voltage of each pillar (Vpillar) can be boosted or increased in accordance with a step or increase of a ramping wordline voltage, as described in greater detail with respect to FIG. 5.

As shown in FIG. 5, in step 1 of the soft erase sub-operation, following a programming pulse, all of the wordlines (e.g., WLn, WLn+1 and above, and WLn−1 and below) are discharged or lowered to approximately a ground voltage level (e.g., approximately 0V). In an embodiment, one or more bitlines corresponding to the target memory cells are also at approximately 0V, such that the pillar voltage is also approximately 0V, because SGD s turned on.

In step 2, the one or more pillars associated with memory cells being programmed are floated by applying a first bitline voltage level (e.g., Vbl=VCC or approximately 2.3V) to the corresponding bitlines. In an embodiment, the pillars corresponding to the levels in program are floated so that the pillar voltage can be boosted during the subsequent step (step 3). In an embodiment, the select gate drain (SGD) is on when the one or more pillars in program are floated. In an embodiment, the one or more pillars associated with memory cells that have passed programming are configured to conduct by setting the corresponding bitline voltage to approximately 0V (SGD is on) so that these pillars are not boosted up (e.g., not subjected to the soft erase). FIG. 6 illustrates an example pillar corresponding to a level being programmed (i.e., in program) 605 that has a corresponding bitline with a bitline voltage (Vbl=VCC) applied in step 2 to float the pillar 605.

In step 3, in an embodiment, all wordlines (WLn, WLn−1 and below and WLn+1 and above) are charged to a Vpass voltage level (e.g., Vpass=~8V or higher for some wordline groups that may require a higher voltage to program). In another embodiment, the target wordline (WLn) and one or more lower wordlines (e.g., WLn−1 and below) can be maintained at approximately 0V (i.e., in view of the discharge of step 1) while one or higher wordlines (e.g., WLn+1 and above) are charged to the Vpass voltage level. In another embodiment, the target wordline (WLn) can be maintained at approximately 0V while the lower wordlines (WLn−1 and below) and higher wordlines (WLn+1 and above) are charged to the Vpass voltage level.

As shown in FIG. 6, in an embodiment (represented as step 3A), the target wordline WLn is charged to the Vpass voltage level. In another embodiment (represented as step 3B), the target wordline WLn is maintained at approximately 0V. Also as shown in FIG. 6, in an embodiment, in step 3 the unselected wordlines (WLn+1 and above and WLn−1 and below) are charged to the Vpass voltage level. Although not shown in FIG. 6, it is noted that, in an embodiment, wordlines WLn−1 and below may be maintained at approximately a ground voltage level (e.g, ~0V) in step 3.

In step 4, the target wordline (WLn) is discharged to (or maintained at) approximately 0V or lower (e.g., a negative voltage level such as approximately −2.5V). In an embodiment, in step 4, the unselected wordlines are maintained or kept at a current voltage level (e.g., approximately Vpass or higher or approximately a ground voltage level or approximately 0V). In an embodiment, following step 4, the threshold voltage for the target wordline is set at a programmed voltage level. In addition, the programmed wordlines (e.g., WLn−1 and below) have a threshold voltage at the programmed voltage level and the higher wordlines that have not yet been programmed have a threshold voltage level at an erase voltage level. The threshold voltage levels of the wordlines are verified by the subsequent program verify sub-operation of the push-pull programming algorithm.

In an embodiment, as a result of steps 1 to 4, the soft erase has been applied to the target wordline to accelerate the charge loss prior to the program verify sub-operation. In an embodiment, in view of the soft erase sub-operation, the pillar associated with the target memory cell has a potential of between approximately 0V to −2.5V and the pillar associated with the lower wordlines and higher wordlines has a potential of approximately 8V. In an embodiment, current flows from the channels of the memory cells on higher wordlines (and also the channel of the memory cells on lower wordlines when the lower wordlines are charged to the Vpass level) to the channel of the memory cells on the target wordline due to gate induced drain lowering (GIDL).

In an embodiment, the soft erase sub-operation subjects the one or more target memory cells of the target wordline an erase bias or reverse bias (relative to the program bias) in a range of approximately 8V to 10V or higher (e.g., Vpillar=Vpass−(−2.5V)). In an embodiment, following step 4, the wordline voltage of the selected wordline is lower than the pillar voltage, an erase polarity on the memory cells being programmed is established, and the soft erase voltage is approximately 8V to 10V or higher. In an embodiment, the bitline voltage is approximately VCC (e.g., approximately 2.3V), the Vpillar is approximately 8V or higher, the target wordline voltage $V_{WLn}$ is approximately 0V to −2.5V, and the soft erase bias is equivalent do approximately Vpillar−$V_{WLn}$(e.g., [8V or higher]−[0V to −2.5V]).

In an embodiment, the pillar is floated and boosted (e.g., steps 2 and 3) to approximately Vpass and the selected wordline is set to 0V to −2.5V (e.g., step 4) to establish an erase bias voltage of approximately 10V or higher on the one or more target memory cells. As shown in FIG. 6, an example target memory cell 610 has an erase bias voltage of approximately 10V following the soft erase sub-operation. In an embodiment, the applied erase bias voltage enables the acceleration of the charge loss and "pulling" of the shallow trap electrons from the one or more memory cells being programmed and back into the channel.

Figure 7:
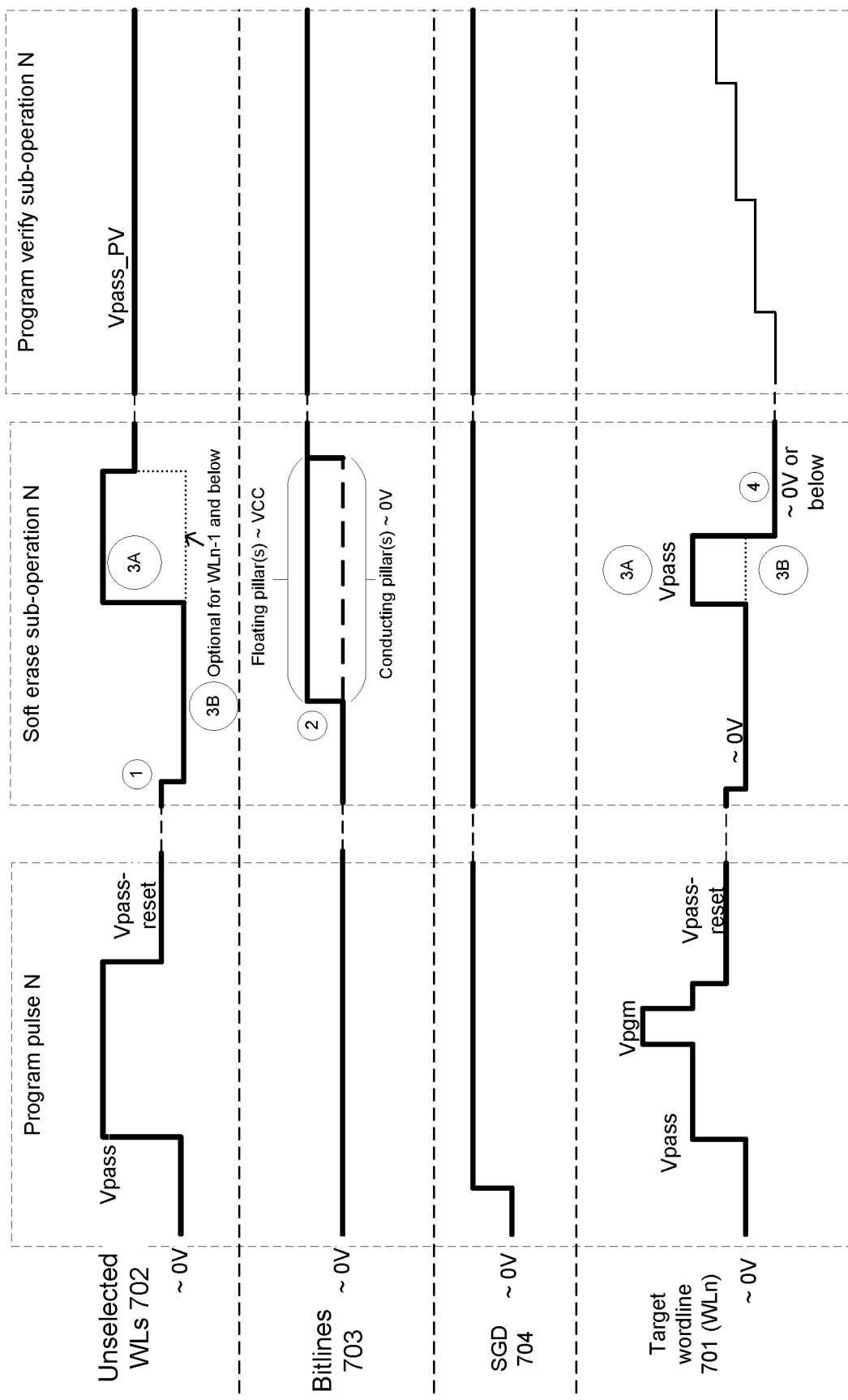
FIG. 7 illustrates example waveforms corresponding to a programming operation including an erase sub-operation to manage charge loss acceleration during programming of a memory cells of a memory device in a memory sub-system in accordance with one or more embodiments of the present disclosure.

FIG. 7 illustrates example voltage waveforms of various portions of a memory array during execution of a portion of a push-pull programming algorithm, according to embodiments of the present disclosure. In an embodiment, the portions of the memory array include a set of memory cells associated with a target wordline 701 (WLn) and portions of corresponding voltage waveforms resulting from execution of a programming pulse phase, a soft erase sub-operation, and a program verify sub-operation of the push-pull programming algorithm, according to embodiments of the present disclosure. In an embodiment, the processing logic identifies a set of memory cells to be programmed by the push-pull programming operation (e.g., target wordline 701 (WLn)). In an embodiment, the push-pull programming algorithm includes a series of ramping or incrementally-increasing programming pulses (e.g., programming pulse N) that are each followed by a soft erase sub-operation (e.g., soft erase sub-operation N), and a program verify sub-operation (e.g., program verify sub-operation N). For example, as shown in FIG. 7, a programming pulse (programming pulse N) is applied to wordline 701 (e.g., a ramping from approximately 0V to a Vpass voltage level, to a Vpgm voltage level to a Vpass_reset voltage level (e.g., approximately 0V to 4V). In an embodiment, during the programming pulse, the bitlines of the memory array have a voltage level of approximately 0V.

In an embodiment, following the programming pulse, the soft erase sub-operation is executed. In an embodiment, in step 1 of the soft erase sub-operation, all of the wordlines are discharged to approximately 0V, as shown in the waveforms of FIG. 7. Next, in step 2, a first portion of the bitlines 703 corresponding to the one or more levels being programmed are charged to a VCC voltage level and a second portion of the bitlines 703 corresponding to the one or more levels that passed programming are maintained at approximately 0V, where SGD 704 is on. In an embodiment, the one or more pillars associated with the levels being programmed are floated by setting the corresponding bitline voltage to VCC. In an embodiment, the one or more pillars associated with the levels that passed programming are conducting by setting or maintaining the bitline voltage level at approximately 0V.

In an embodiment, in step 3, according to a first variation (step 3A in FIG. 7), the target wordline voltage and unselected wordline voltages are charged to approximately Vpass. In an embodiment, according to a second variation (step 3B in FIG. 7), the target wordline 701 is maintained at approximately 0V and, optionally, the lower wordlines (WLn−1 and below) are maintained at approximately 0V while the higher wordlines (WLn+1 and above) are charged to Vpass.

In an embodiment, in step 4, a reverse bias is applied to the target wordline 701 to establish a voltage in a range of approximately 0V to approximately −2.5V. In an embodiment, as a result of the soft erase sub-operation N (e.g., steps 1-4), the one or more target memory cells of the target wordline 701 have an erase voltage (Vera) of approximately 10V (e.g., Vpass−(−2.5V). This enables the acceleration of the charge loss of the shallow trap electrons to pull those electrons back into the channel from the target memory cells.

As shown in FIG. 7, following completion of the soft erase sub-operation N, program verify sub-operation N is executed to verify whether the target memory cells have passed programming or if those memory cells are to be subjected to one or more further programming pulses of the push-pull programming algorithm. Advantageously, the accuracy of the program verify sub-operation is improved in view of the acceleration of the charge loss resulting from the execution of the soft erase sub-operation. This results in the tightening of the threshold voltage distributions and improvement of the RWB.

Figure 8:
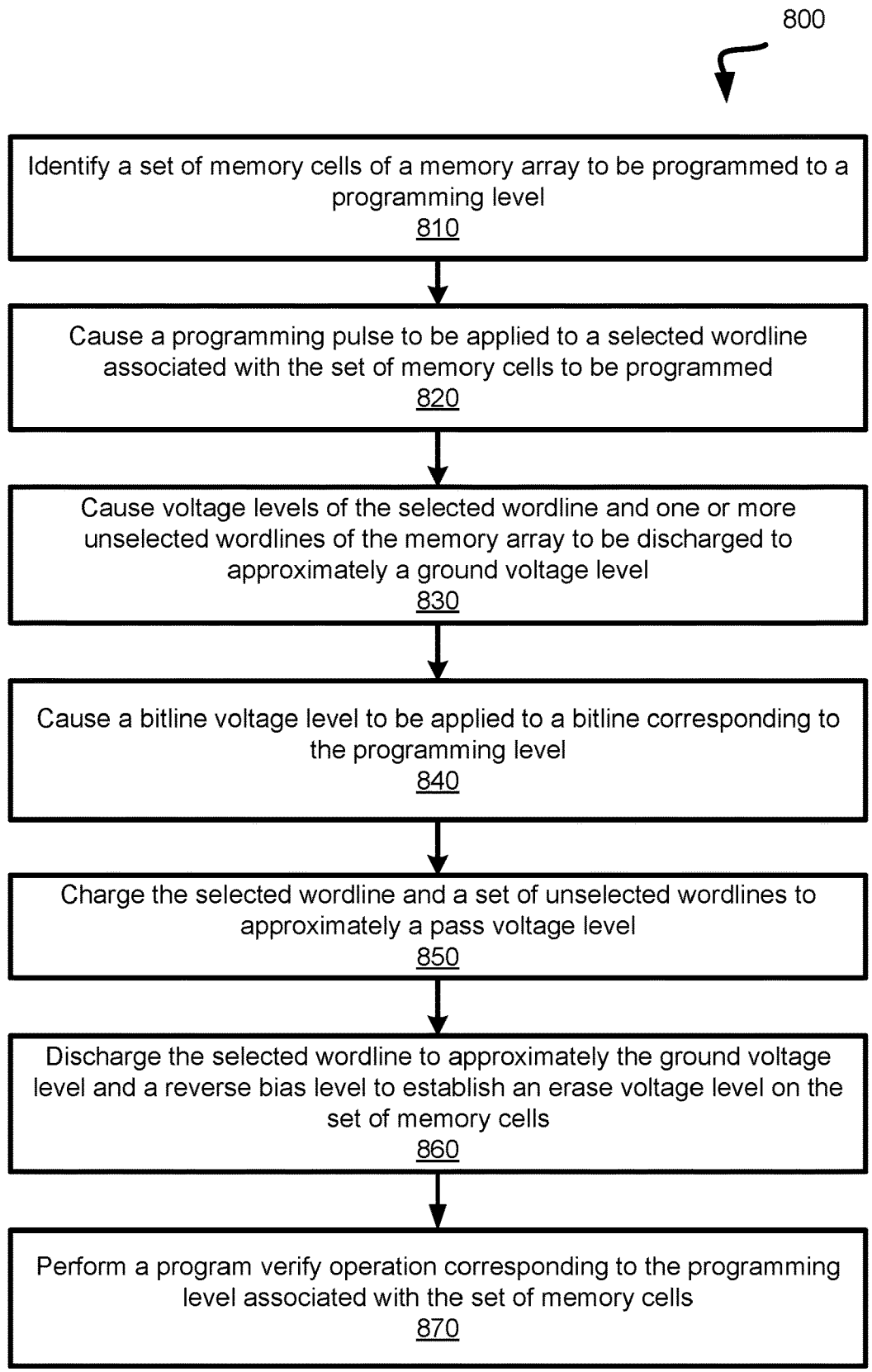
FIG. 8 is a flow diagram of an example method of a programming operation including an erase sub-operation to manage charge loss acceleration of one or more target memory cells of a memory device in a memory sub-system in accordance with one or more embodiments of the present disclosure.

FIG. 8 is a flow diagram of an example method 800 of a portion of a push-pull programming algorithm including a soft erase sub-operation to program one or more target memory cells of a memory device in a memory sub-system in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by program manager 134 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, a set of memory cells is identified. For example, processing logic (e.g., program manager 134) can identify a set of memory cells of a memory array to be programmed to a programming level. In an embodiment, the processing logic can receive, from a requestor, such as a memory interface 113 of a memory sub-system controller 115, a request to perform a memory access operation on a memory array, such as memory array 250, of a memory device, such as memory device 130. In one embodiment, the memory access operation comprises a program operation to program the set of memory cells to a set of programming levels (e.g., L1 to L7; wherein L0 is an erase state). In an embodiment, the program operation is directed to one or more specific memory cell addresses. In one embodiment, the set of memory cells are configured as MLC memory (e.g., any type of memory cells that store more than one bit per cell including 2 bits, 3 bits, 4 bits, or more bits per cell). In an embodiment, the identified set of memory cells are to be programmed to multiple programming levels (e.g., L1, L2 . . . L7 for a TLC memory device). In an embodiment, the request includes a set of physical or logical addresses corresponding to the set of memory cells to be programmed. In an embodiment, the processing logic identifies the set of memory cells based on the set of addresses provided as part of the request.

At operation 820, a programming pulse is applied. For example, the processing logic can cause programming pulse to be applied to a selected wordline associated with the set of memory cells to be programmed. In an embodiment, the programming pulse can be one of a series of programming pulses that are applied to program the different programming levels as part of the push-pull programming algorithm. In an embodiment, the programming pulse applied to the target wordline can cause shallow trap electrons to be pushed from the channel to the memory cells. This "push" stage of the programming algorithm can result in a later charge loss of those shallow trap electrons which is accelerated and addressed in the subsequent operations of method 800 to improve the RWB of the resulting threshold voltage distributions.

At operation 830, a discharge is performed. For example, the processing logic can cause voltage levels of the selected wordline and one or more unselected wordlines of the memory array to be discharged to approximately a ground voltage level (e.g., approximately 0V).

At operation 840, a voltage is applied. For example, the processing logic causes a bitline voltage level (e.g., Vbl=VCC) to be applied to a bitline corresponding to the programming level (i.e., a level that is currently being programmed and has not yet passed programming). In an embodiment, the setting of the bitline voltage level (e.g., Vbl=VCC) floats the corresponding pillar so that the pillar voltage can be boosted. In an embodiment, at operation 840, a bitline voltage of one or more bitlines corresponding to programming levels that have passed programming is set to approximately a ground voltage level (e.g., approximately 0V) to enable the corresponding pillar to conduct and prevent further programming and pillar voltage boosting.

At operation 850, one or more wordlines are charged. For example, the processing logic can charge the selected wordline and a set of unselected wordlines (i.e., the unselected wordlines that are above the selected wordline such (WLn+1 and above)) to approximately a pass voltage level (e.g., Vpass or higher). In an embodiment, at operation 850, unselected wordlines that are lower than the selected wordline (e.g., WLn−1 and below that have already passed programming) are also charged to the pass voltage level (e.g., Vpass or higher) or maintained at approximately 0V. In an embodiment, at operation 850, unselected wordlines that are higher than the selected wordline (e.g., WLn+1 an above that have not yet passed programming) are charged to approximately the pass voltage level (e.g., approximately Vpass or higher).

At operation 860, a voltage level is established. For example, the processing logic can discharge the selected wordline to approximately the ground voltage level (e.g., approximately 0V) or a reverse bias level to establish an erase voltage level on the set of memory cells. In an embodiment, the reverse bias level is in a range of approximately less than 0V to approximately −2.5V. By discharging the selected wordline to this level, the corresponding set of memory cells being programmed see an erase voltage level of approximately 10V. The erase voltage level (e.g., approximately 10V) is a "softer" or lower erase voltage as compared to a typical "hard" erase voltage level of approximately 20V or higher. The setting of the erase voltage level on the set of memory cells being programmed results in the acceleration of the charge loss of the shallow trap electrons which are pulled back into the channel from the memory cell. In an embodiment, operations 830 through 860 represent the soft erase sub-operation of the push-pull programming algorithm. In an embodiment, the programming pulse phase of the push-pull programming algorithm causes the shallow trap electrons to be pushed from the channel into the memory cell and the soft erase sub-operation causes the shallow trap electrons to be pulled from the memory cell into the channel.

At operation 870, a verification operation is performed. For example, the processing logic performs a program verify operation corresponding to the programming level. In an embodiment, the program verify operation to determine if the set of memory cells reached a voltage that passed the programming level associated with the corresponding programming level.

In an embodiment, operations of method 800 can be iteratively executed as part of the push-pull programming algorithm until the memory cells identified for programming have been successfully programmed to the target or desired programming level. Following each programming pulse (operation 820) of the set of programming pulses, a soft erase sub-operation (e.g., operations 830-860), and program verify operation (operation 870) can be performed for each programming level to verify that target voltage corresponding to each respective programming level has been reached. In an embodiment, the processing logic completes the execution of method 800 in response to verifying (using program verify operations) that all of the programming levels have been programmed.

Figure 9:
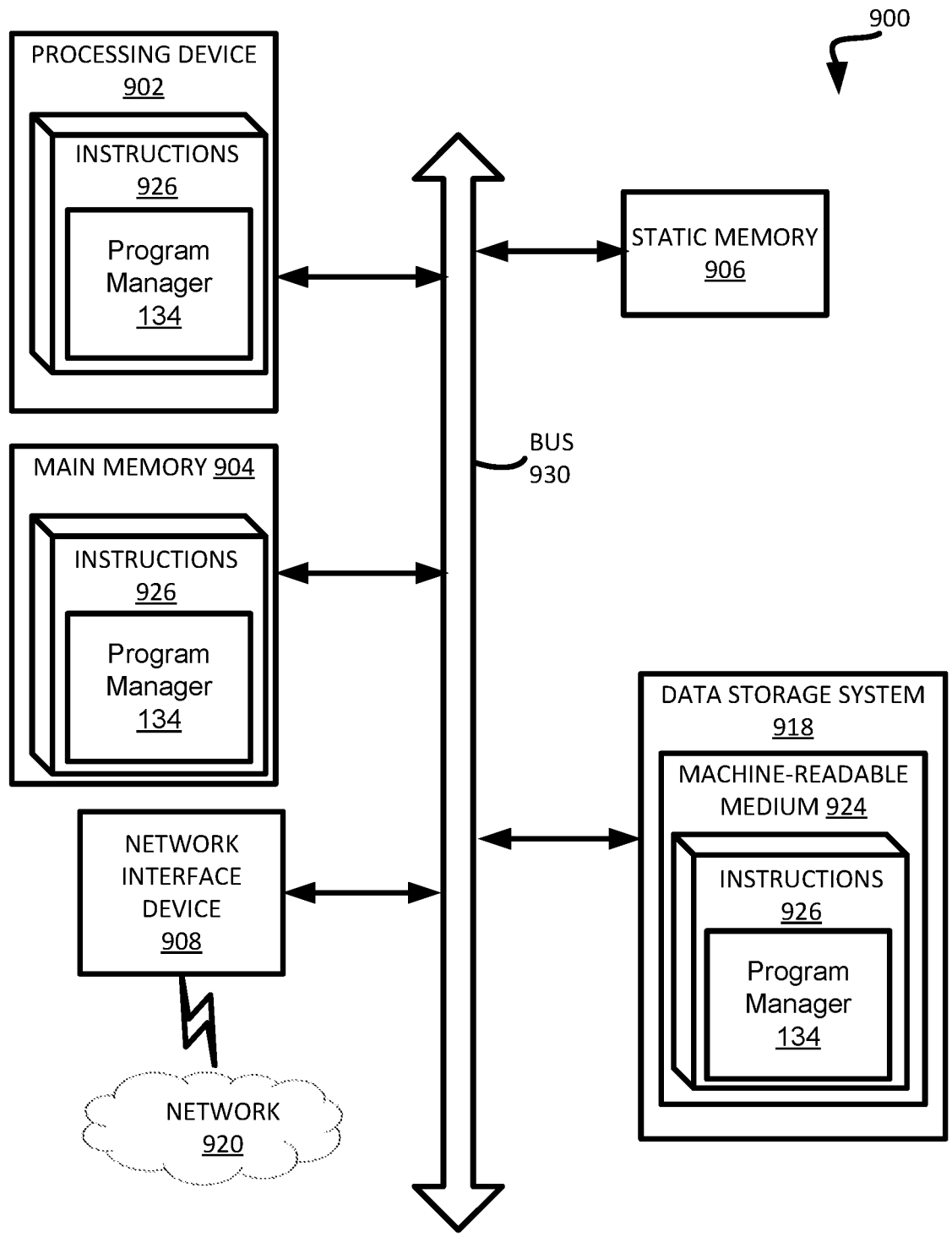
FIG. 9 is a block diagram of an example computer system in which embodiments of the present disclosure can operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to program manager 134 of FIGS. 1A and 1B). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium, such as a non-transitory computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1A.

In one embodiment, the instructions 926 include instructions to implement functionality corresponding to program manager 134 of FIGS. 1A and 1B). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array comprising a set of memory cells; and
control logic, operatively coupled with the memory array, to perform operations comprising:
  causing a programming pulse of a set of programming pulses associated with a programming algorithm to be applied to a selected wordline associated with the set of memory cells to be programmed to a target voltage level representing a programming level;
  causing voltage levels of the selected wordline and one or more unselected wordlines of the memory array to be discharged to approximately a ground voltage level;
  causing a bitline voltage level to be applied to a bitline of the memory array corresponding to the programming level;
  charging the selected wordline and a set of unselected wordlines to approximately a pass voltage level;
  discharging the selected wordline to approximately the ground voltage level or a reverse bias level to establish an erase voltage level on the set of memory cells; and
  performing a program verify operation corresponding to the programming level associated with the set of memory cells.

2. The memory device of claim 1, wherein establishing the erase voltage level on the set of memory cells accelerates a charge loss associated with one or more electrons.

3. The memory device of claim 1, wherein applying the programming pulse to the selected wordline causes a set of electrons of a memory cell of the set of memory cells to move from a channel associated with the memory cell to the memory cell.

4. The memory device of claim 3, wherein establishing the erase voltage level on the set of memory cells causes at least a portion of the set of electrons to move from the memory cell to the channel associated with the memory cell.

5. The memory device of claim 1, wherein the set of unselected wordlines comprises one or more wordlines above the selected wordline.

6. The memory device of claim 1, wherein a pillar corresponding to the programming level is floated in response to causing the bitline voltage level to be applied to the bitline.

7. The memory device of claim 1, wherein the reverse bias level is in a range of approximately 0V to approximately −2.5V.

8. The memory device of claim 1, wherein the pass voltage level comprise approximately 8V or higher.

9. The memory device of claim 1, wherein a further set of unselected wordlines below the selected wordline are charged to approximately the pass voltage level when the selected wordline and the set of unselected wordlines are charged to approximately the pass voltage level.

10. The memory device of claim 1, wherein a voltage level of the unselected wordlines is maintained during the discharging of the selected wordline to the reverse bias level.

11. A method comprising:
initiating a programming algorithm to program a memory cell of a memory array to a first target voltage level representing a first programming level of a plurality of programming levels, wherein the memory array comprises a selected wordline associated with the memory cell, a first set of unselected wordlines below the selected wordline, and a second set of unselected wordlines above the selected wordline;
causing a first programming pulse of a series of programming pulses of the programming algorithm to be applied to the selected wordline associated with the memory cell, wherein a charge loss associated with the memory cell occurs following application of the first programming pulse;
following the first programming pulse, performing an erase sub-operation comprising applying an erase voltage to the selected wordline to accelerate the charge loss associated with the memory cell; and following the erase sub-operation, performing a program verify operation corresponding to the first programming level to determine that a threshold voltage of the memory cell exceeds the first target voltage level.

12. The method of claim 11, wherein performing the erase sub-operation comprises:

causing voltage levels of the selected wordline, the first set of unselected wordlines below the selected wordline, and the second set of unselected wordlines above the selected wordline to be discharged to approximately a ground voltage level;

causing a bitline voltage level to be applied to a bitline corresponding to the first programming level;

charging the selected wordline and the second set of unselected wordlines above the selected wordline to approximately a pass voltage level; and discharging the selected wordline to approximately the ground voltage level or a reverse bias level to establish an erase voltage level on the memory cell.

13. The method of claim 12, wherein the erase voltage level on the memory cell is a difference between approximately the pass voltage level and the reverse bias level of the selected wordline.

14. The method of claim 12, wherein a pillar corresponding to the first programming level is floated in response to causing the bitline voltage level to be applied to the bitline.

15. The method of claim 14, wherein a voltage of the pillar is boosted in response to charging the selected wordline and the second set of unselected wordlines above the selected wordline to approximately the pass voltage level.

16. The method of claim 12, wherein applying the first programming pulse to the selected wordline causes a set of electrons of the memory cell to move from a channel associated with the memory cell to the memory cell.

17. The method of claim 16, wherein establishing the erase voltage level on the memory cell causes at least a portion of the set of electrons to move from the memory cell to the channel associated with the memory cell.

18. A memory device comprising:

a memory array comprising a plurality of memory cells comprising a memory cell; and control logic, operatively coupled with the memory array, to perform operations comprising:

initiating a programming algorithm to program the memory cell of the memory array to a first target voltage level representing a first programming level of a plurality of programming levels, wherein the memory array comprises a selected wordline associated with the memory cell, a first set of unselected wordlines below the selected wordline, and a second set of unselected wordlines above the selected wordline;

causing a first programming pulse of a series of programming pulses of the programming algorithm to be applied to the selected wordline associated with the memory cell, wherein a charge loss associated with the memory cell occurs following application of the first programming pulse;

following the first programming pulse, performing an erase sub-operation comprising applying an erase voltage to the selected wordline to accelerate the charge loss associated with the memory cell; and following the erase sub-operation, performing a program verify operation corresponding to the first programming level to determine that a threshold voltage of the memory cell exceeds the first target voltage level.

19. The memory device of claim 18, wherein performing the erase sub-operation comprises:

causing voltage levels of the selected wordline, the first set of unselected wordlines below the selected wordline, and the second set of unselected wordlines above the selected wordline to be discharged to approximately a ground voltage level;

causing a bitline voltage level to be applied to a bitline corresponding to the first programming level;

charging the selected wordline and the second set of unselected wordlines above the selected wordline to approximately a pass voltage level; and discharging the selected wordline to approximately the ground voltage level or a reverse bias level to establish an erase voltage level on the memory cell.

20. The memory device of claim 19, wherein applying the first programming pulse to the selected wordline causes a set of electrons of the memory cell to move from a channel associated with the memory cell to the memory cell; and wherein establishing the erase voltage level on the memory cell causes at least a portion of the set of electrons to move from the memory cell to the channel associated with the memory cell.

* * * * *